United States Patent
Le et al.

[11] Patent Number: 6,137,153
[45] Date of Patent: Oct. 24, 2000

[54] FLOATING GATE CAPACITOR FOR USE IN VOLTAGE REGULATORS

[75] Inventors: Binh Q. Le, Mountain View; Pau-ling Chen, Saratoga; Shane C. Hollmer, San Jose, all of Calif.

[73] Assignee: Advanced Micro Devices, Inc., Sunnyvale, Calif.

[21] Appl. No.: 09/023,497

[22] Filed: Feb. 13, 1998

[51] Int. Cl.$^7$ .................................................. H01L 29/00
[52] U.S. Cl. ........................ 257/532; 257/299; 257/312
[58] Field of Search ................................. 257/532, 315, 257/299, 298, 312; 265/185.27; 438/238

[56] References Cited

U.S. PATENT DOCUMENTS

| | | | |
|---|---|---|---|
| 4,591,738 | 5/1986 | Bialas, Jr. et al. | 257/299 |
| 5,111,427 | 5/1992 | Kobayashi et al. | 365/49 |
| 5,299,162 | 3/1994 | Kim et al. | 365/201 |
| 5,361,235 | 11/1994 | Kodama | 365/218 |
| 5,491,657 | 2/1996 | Haddad et al. | 365/185.27 |
| 5,521,864 | 5/1996 | Kobayashi et al. | 365/185.22 |
| 5,617,357 | 4/1997 | Haddad et al. | 365/185.27 |
| 5,828,095 | 10/1998 | Merritt | 257/299 |
| 5,898,613 | 4/1999 | Diorio et al. | 257/315 |

*Primary Examiner*—Olik Chaudhuri
*Assistant Examiner*—Phat X. Cao
*Attorney, Agent, or Firm*—Skjerven, Morrill, Morrill, MacPherson, Franklin & Friel, LLP; Tom Chen, Esq.

[57] ABSTRACT

A capacitor structure which exhibits a constant capacitance at non-negative voltages is provided by erasing a P-well floating gate NMOS transistor prior to its use as a capacitor. By erasing the transistor, a negative threshold voltage is obtained, thereby turning on the transistor and placing the transistor in an inversion state where the MOS capacitance is voltage-independent. Such transistors can be utilized as capacitors, whereby one plate of the capacitor corresponds to the control gate of the transistor and the other plate corresponds to the commonly connected source, drain, P-well, and deep N-well regions of the transistor, in voltage regulator circuits or other circuits in which node stabilization is desired. As a result, the capacitance is constant even at initialization when zero volts is applied.

7 Claims, 2 Drawing Sheets

FLOATING GATE CAPACITOR FOR USE IN VOLTAGE REGULATORS

BACKGROUND

1. Field of Invention

The present invention relates to capacitor structures, and more particularly to such structures for use in voltage regulators.

2. Related Art

In electronic circuits, when a constant voltage is required by an electronic device, the power supply must be able to provide a regulated supply voltage from a variable voltage source, such as a battery. Various types of such voltage regulators are well known in the art. For example, FIG. 1 shows one type of voltage regulator 10, utilizing a capacitor divider circuit. Voltage regulator 10 includes two capacitors C1 and C2 connected in series with a high voltage source $V_{pp}$ which is to be regulated. A divided voltage $V_{div}$, taken between capacitors C1 and C2 at node A, is used as one input to an operational amplifier (op amp) 11, with the other input being a reference voltage $V_{ref}$. Op amp 11 compares the two voltages $V_{div}$ and $V_{ref}$ and outputs a difference signal to a pass transistor 12 to regulate voltage $V_{pp}$.

$V_{pp}$ can be determined precisely using conservation of charge, as follows. At time t=0, NMOS pass transistors 13 and 14 are turned on by setting initialization signal INIT high, and PMOS transistor 15, whose N-well is connected to $V_{pp}$ (not shown), is turned off by setting voltage $V_{cc}$ high. As a result, $V_{div}$ at node A is pulled to ground by NMOS transistor 13, and the voltage at node B is pulled to $V_{ref}$ by NMOS transistor 14. Thus, the initial charge $Q_i$ stored at node A is given by $$Q_i = (0 - V_{ref})c_1 + 0^* c_2 = -c_1 V_{ref} \quad (1)$$

After initialization or pre-charge, signal INIT is turned off, thereby turning off NMOS transistors 13 and 14. The voltage at node A, $V_{div}$, rises to $V_{ref}$, while the voltage at node B goes to $V_{pp}$. Thus, the final charge $Q_f$ is given by $$Q_f = (V_{ref} - V_{pp})c_1 + V_{ref} c_2 \quad (2)$$

Equating equations (1) and (2) and solving for $V_{pp}$ yields $$V_{pp} = V_{ref}(2 + c_2/c_1) \quad (3)$$

Consequently, $V_{pp}$ can be obtained precisely according to equation (3), provided that capacitors C1 and C2 have capacitances independent of the voltage across the capacitors.

However, capacitors C1 and C2 are typically conventional N-well MOS structures, whose capacitance depends on the state of the semiconductor surface, i.e., whether the MOS capacitor is in an accumulation, depletion, or inversion state. FIG. 2 shows a typical curve representing the capacitance of an N-well MOS capacitor as a function of the voltage across the capacitor or gate-to-substrate voltage $V_{gs}$. As seen from FIG. 2, for positive $V_{gs}$, capacitance is essentially voltage-independent when $V_{gs}$ exceeds a certain positive voltage $V_a$, corresponding to the device being in a strong accumulation state.

Accordingly, because the bias voltage or $V_{gs}$ for capacitor C2 is initially zero (since $V_{div}$ is initially zero volts), capacitor C2 is not yet in this strong accumulation state, and thus capacitance $c_2$ is still voltage dependent. As a result, the accuracy of regulating voltage $V_{pp}$ decreases. Therefore, it is desirable to have a capacitor structure, for use in a voltage regulator, that exhibits a constant capacitance even at a zero bias voltage level.

SUMMARY

The present invention provides a capacitor structure for use in a voltage regulator circuit, whereby the capacitor provides a constant capacitance even at a zero bias voltage level, thereby allowing the voltage regulator circuit to precisely regulate the incoming voltage. By using a P-well floating gate NMOS transistor as the capacitor in a voltage regulator circuit or other circuit for stabilizing a node, a negative threshold voltage for the capacitor can be obtained by erasing the transistor prior to use, which allows the transistor to turn on even when zero volts is applied to the transistor. As a result, during initial operation of the voltage regulator circuit, the capacitor is already in a state where the capacitance is essentially voltage-independent, corresponding to an inversion state.

The capacitor according to the present invention is an NMOS floating gate transistor having N-type drain and source regions formed within a P-well. The P-well is formed within a deep N-well, which in turn is formed within a P-type substrate. A polysilicon floating gate overlies a channel region between the source and drain regions, and a polysilicon control gate overlies the floating gate, with insulative layers separating the control gate from the floating gate and the floating gate from the channel. The source and drain regions are commonly connected to a P+ contact and an N+ contact formed within the P-well and N-well, respectively. Manufacturing the floating gate capacitor requires less masking steps than a conventional N+/N+ metal capacitor, thereby reducing both the costs and time associated with making such a capacitor.

The transistor can be erased by applying, for example, zero volts to the control gate of the NMOS transistor and approximately 20 volts to the commonly connected source, drain, and contact regions to force electrons from the floating gate into the substrate. As a result, a negative threshold voltage is obtained so that any non-negative voltage applied to the control gate turns on the transistor or capacitor. Thus, by replacing the capacitor connected between ground and one input of the operational amplifier in a conventional voltage regulator circuit with the capacitor of the present invention, precise voltage regulation is possible even at initialization when the voltage across the capacitor is zero.

The present invention will be more fully understood in light of the following detailed description taken together with the accompanying drawings.

BRIEF DESCRIPTION OF DRAWINGS

Note that use of the same reference numbers in different figures indicates the same or like elements.

DETAILED DESCRIPTION

According to the present invention, a capacitor structure for use in a voltage regulator circuit or other circuit for stabilizing a node is formed as a P-well floating gate NMOS transistor. By first erasing the transistor prior to use in the circuit, the threshold voltage of the transistor can be made negative. As a result, the capacitor turns on and is in a state where the capacitance is essentially voltage-independent even when zero volts is applied to the capacitor. Consequently, precise voltage regulation or node stabilization is possible even during initial use of the circuit.

Figure 3:
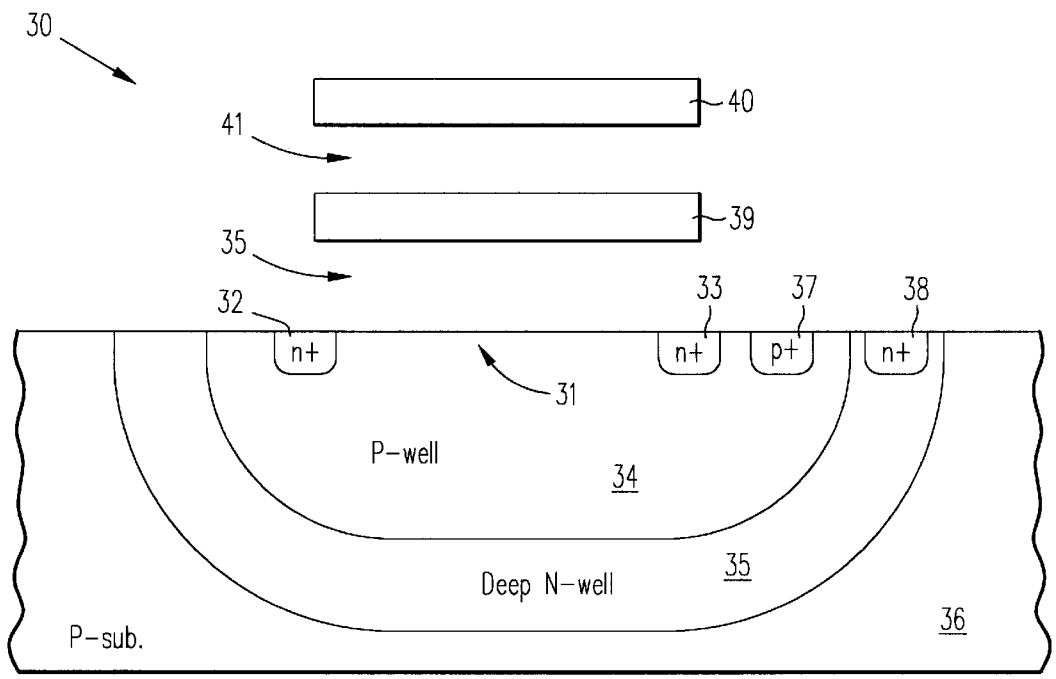
FIG. 3 is a diagram of a capacitor according to the present invention.

FIG. 3 shows an NMOS floating gate transistor 30 for use as a capacitor according to one embodiment of the present invention. Transistor 30 has a channel 31 extending between an N+ source region 32 and an N+ drain region 33 formed in a P-well 34. P-well 34 is formed in a deep N-well 35, which is formed in a P-type substrate 36. A P+ and N+ region at P-well 34 and deep N-well 35 are formed as a P-well contact 37 and an N-well contact 38, respectively. A floating gate 39 is insulated from the surface of P-well 34 by a thin tunneling oxide layer 35 extending over the entire length of channel 31 and portions of both N+ source 32 and N+ drain 33. It should be noted that tunneling oxide layer 35 may be of varying lengths, such as extending only over a portion of N+ drain 33, wherein the remaining surface of P-well 34 has a thick gate oxide layer formed thereon. A control gate 40 is insulated from floating gate 39 by an insulating layer 41.

Transistor 30 can be erased by biasing the substrate to a higher positive voltage than the control gate to force the electrons from the floating gate. For example, an erase operation can be performed by applying approximately 20 volts to N+ source 32, N+ drain 33, P-well 34 (via P-well contact 37), and deep N-well 35 (via N-well contact 38) while control gate 40 is grounded. The equal bias voltages applied to N+ source 32, N+ drain 33, P-well 34, and deep N-well 35 attract electrons stored in floating gate 39. As a result, electrons tunnel from floating gate 39 across the entire length of tunneling oxide layer 35 into channel 31, source 32, and drain 33 to erase transistor 30. As a result, the threshold voltage can be lowered to a negative voltage, such as between −2 and −2.5 V.

Figure 4:
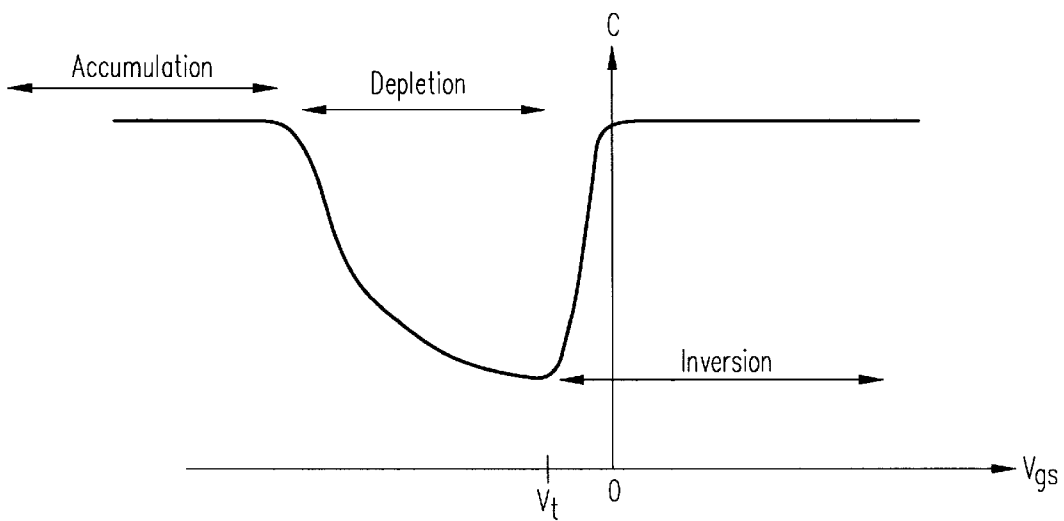
FIG. 4 is a graph showing the capacitance dependence on voltage for the capacitor of FIG. 3.

Accordingly, transistor 30, in its normal or erased state, will turn on even when there is a zero voltage drop between the control gate and the substrate. FIG. 4 shows a typical curve representing the capacitance the P-well NMOS transistor 30 as a function of the gate-to-substrate voltage $V_{gs}$. As $V_{gs}$ is increased, transistor 30 goes from an accumulation state to a depletion state. At low frequencies, transistor 30 goes to an inversion state when $V_{gs}=V_t$, and the capacitance sharply rises to a constant capacitance, namely the gate oxide capacitance $C_{ox}$ of the transistor. As is apparent from FIG. 4, the capacitance is essentially constant whenever $V_{gs}$ is non-negative due to a negative threshold voltage. In other words, any voltage above $V_t$ applied to the control gate forces electrons from the P-substrate toward the surface, which inverts the silicon at the surface to create an N-type channel, resulting in a constant MOS capacitance.

Figure 1:
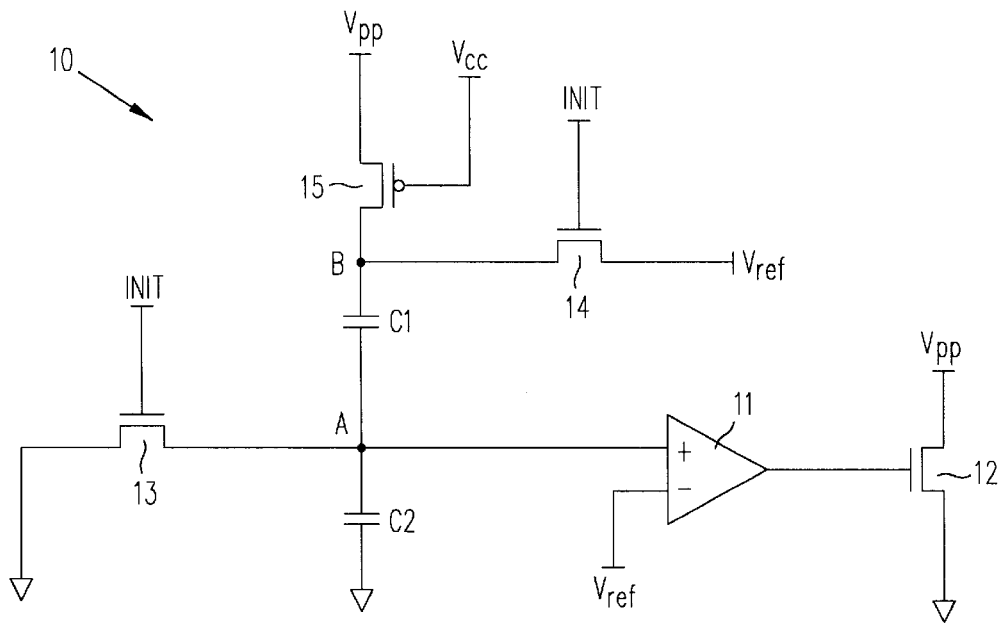
FIG. 1 is a diagram of a conventional voltage regulator.
Figure 2:
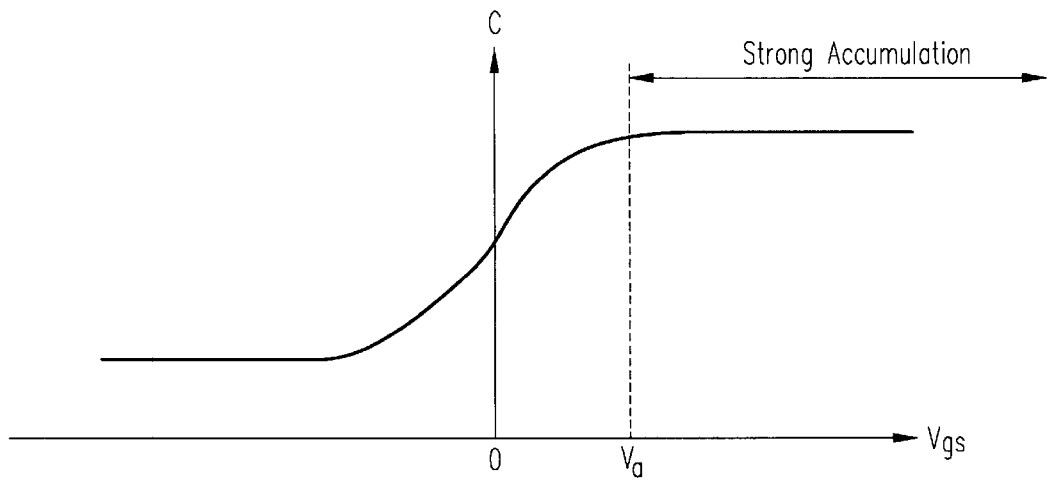
FIG. 2 is graph showing the capacitance dependence on voltage for a conventional NMOS capacitor.

Therefore, after erasing, transistor 30 may be utilized as capacitor C2 in voltage regulator circuit 10 of FIG. 1 to improve voltage regulation. Referring to FIGS. 1 and 3, control gate 40 is connected to node A, while N+ source 32, N+ drain 33, P-well 34 (via P-well contact 37), and deep N-well 35 (via N-well contact 38) are connected to ground. Thus, even at initialization, when node A is at zero volts, the capacitance of capacitor C2 is essentially voltage-independent, thereby allowing precise voltage regulation according to equation (3) above.

The above-described embodiments of the present invention are merely meant to be illustrative and not limiting. It will thus be obvious to those skilled in the art that various changes and modifications may be made without departing from this invention in its broader aspects. Even though described for use in a voltage regulator circuit, such a floating gate capacitor can be used in any circuit desiring node stabilization. Furthermore, other types of floating gate capacitors and methods for erasing the capacitor to reduce the threshold voltage to a negative value in accordance with the present invention are also suitable even though not described herein. Therefore, the appended claims encompass all such changes and modifications as fall within the true spirit and scope of this invention.

We claim:

1. A capacitor having a negative threshold voltage, comprising:

a P-type substrate;

a deep N-well region within said substrate;

a P-well region within said N-well region;

N+ source and drain regions within said P-well region;

a first insulating layer overlying said P-well region;

a floating gate overlying said first insulating layer;

a second insulating layer overlying said floating gate; and a control sate overlying said second insulating layer, wherein said capacitor is used in a voltage regulator circuit, said circuit comprising:

a second capacitor having a first plate coupled to said control gate and a second plate coupled to a voltage to be regulated;

an op amp having a first input coupled between said control gate and said first plate of said second capacitor, a second input connected to a reference voltage, and an output connected to a first pass transistor; and a second pass transistor coupled between ground and said control gate, wherein said source, drain, P-well, and deep N-well regions are commonly connected to ground.

2. The capacitor of claim 1, wherein said negative threshold voltage is obtained by erasing said capacitor.

3. The capacitor of claim 2, wherein said capacitor is erased by applying approximately 20 volts to said source, drain, P-well, and deep N-well regions and applying approximately zero volts to said control gate.

4. The capacitor of claim 1, wherein said threshold voltage in an erased state ranges from −2 to −2.5 volts.

5. The circuit of claim 1, further comprising a third pass transistor coupled between said second plate of said second capacitor and said voltage to be regulated.

6. The capacitor of claim 1, wherein said capacitor is in an inversion mode when the gate-to-substrate voltage of said capacitor is non-negative.

7. The capacitor of claim 1, wherein the capacitance of said capacitor is approximately constant when the gate-to-substrate voltage of said capacitor is non-negative.

* * * * *